United States Patent [19]

Ogawa

[11] Patent Number: 4,568,626
[45] Date of Patent: Feb. 4, 1986

[54] METHOD FOR PRODUCING IMAGE FORMING MEMBER

[75] Inventor: Kyosuke Ogawa, Tokyo, Japan

[73] Assignee: Canon Kabushiki Kaisha, Tokyo, Japan

[21] Appl. No.: 603,306

[22] Filed: Apr. 24, 1984

[30] Foreign Application Priority Data

Apr. 28, 1983 [JP] Japan .................................. 58-75270

[51] Int. Cl.$^4$ ............................................. G03G 5/082
[52] U.S. Cl. ..................................... 430/128; 427/38; 427/39; 427/86
[58] Field of Search .................... 430/128; 427/38, 39, 427/86

[56] References Cited

U.S. PATENT DOCUMENTS 4,468,443  8/1984  Shimizu et al. ..................... 430/128

*Primary Examiner*—John D. Welsh
*Attorney, Agent, or Firm*—Fitzpatrick, Cella, Harper & Scinto

[57] ABSTRACT

A method for producing an image forming member having a deposited layer with photoconductivity formed on a support by introducing a starting material in gaseous state into a deposition chamber which is reduced to a desired pressure and exciting discharging in the gas atmosphere of said starting material, comprises constituting at least a part of said deposited layer of a layer (A) comprising silicon atoms, carbon atoms and hydrogen atoms, said layer (A) being formed of at least one of the compounds represented by the formula:

$$R_m Si_n H_{2n+2-m} \qquad (I)$$

where R is an alkyl having 1 to 15 carbon atoms, m is an integer of 1 to 15, n is an integer of 1 to 5, and m and n satisfy the relation of $2n+2 > m$.

12 Claims, 1 Drawing Figure

METHOD FOR PRODUCING IMAGE FORMING MEMBER

BACKGROUND OF THE INVENTION

1. Field of the Invention

This invention relates to a method for producing an image forming member having sensitivity to electromagnetic waves such as light (herein used in a broad sense, including untraviolet rays, visible light, infrared rays, X-rays and gamma-rays).

2. Description of the Prior Art

Photoconductive materials, which constitute image forming members for electrophotography in solid state image pick-up devices or in the field of image formation, or photoconductive layers in manuscript reading devices, are required to have a high sensitivity, a high SN ratio (Photocurrent $(I_p)/(I_d)$), spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as a-Si) has recently attracted attention as a photoconductive material. For example, German OLS Nos. 2,746,967 and 2,855,718 disclose applications of a-Si for use in image forming members for electrophotography, and German OLS No. 2,933,411 discloses an application of a-Si for use in a photoelectric converting reading device.

However, under the present situation, the photoconductive members of the prior art having light-receiving layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed.

Further, according to a large number of experiments by the present inventors, a-Si as the material constituting the photoconductive layer of an image forming member for electrophotography, while it has a number of advantages, as compared with inorganic photoconductive materials such as Se, CdS, ZnO and the like or organic photoconductive materials such as PVCz, TNF and the like of prior art, is also found to have problems to be solved. Namely, when charging treatment is applied for formation of electrostatic images on the light-receiving layer of an image forming member for electrophotography having a light-receiving member constituted of a mono-layer of a-Si which has been endowed with characteristics for use in a solar battery of prior art, dark decay is markedly rapid, whereby it is difficult to apply a conventional electrophotographic process. Moreover, this tendency is further pronounced under a humid atmosphere to such an extent in some cases that no charge is retained at all before development time.

Further, a-Si materials may contain as constituent atoms hydrogen atoms or halogen atoms such as fluorine atoms, chlorine atoms, etc. for improving their electrical, photoconductive characteristics, boron atoms, phosphorus atoms, etc. for controlling the electroconduction type, or carbon atoms, nitrogen atoms, oxygen atoms and others for improvement of other characteristics or for the purpose of lamination of another layer for separate function. Depending on the manner in which these constituent atoms are contained, there may sometimes be caused various problems in the image forming member formed.

Especially, the layer containing carbon atoms is very important, since it can be utilized for a wide scope of purposes in addition to making higher dark resistances, such as improvement of adhesion, controlling of the optical forbidden band gap, imparting of layer hardness, formation of insulating layer, etc. Accordingly, depending on these purposes, it is frequently required to change the content of carbon atoms to a great extent. For this reason, according to the prior method, in which the source for supplying silicon atoms and the source for supplying carbon atoms have been found in separate starting materials, a large number of parameters must be operated and optimization of such parameters was encountered by an extreme difficulty.

Also, during formation of a deposited film by discharging decomposition such as by glow discharging, etc., when the deposited film is constituted of a plurality of constituent atoms and the sources for supplying respective constituent atoms are different molecules, it is preferred for obtaining a deposited film having good characteristics that the decomposition energies of the respective starting molecules by discharging should be substantially the same. However, hydrocarbon gases such as $CH_4$ or $C_2H_4$ conventionally used for formation of a film of carbon containing hydrogenated silicon (hereinafter written as $Si_xC_{1-x}(H)$) are higher in decomposition energy under discharging of molecules for supplying carbon atoms into the deposited film than the decomposition energy of a silane type gas which is the supplying source of silicon atoms, whereby it is difficult to obtain a good deposited film. Even if a good film may be obtained, inconveniences were frequently caused such that the preferably preparation conditions were restricted extremely.

For avoiding such a problem, it is also known to use a gas containing silicon atoms and carbon atoms in one molecule, for example, a gas of $Si(CH_3)_4$ and the like. In this case, the content ratio of silicon atoms to carbon atoms in the deposited film is restricted by the constituent atomic content ratio in the molecule, and the hydrogen atoms appear to be supplied into the deposited film in the form previously added to carbon atom as $—CH_3$, whereby there is the fear of disadvantageous excessive introduction of hydrogen atoms. Thus, this method was also inconvenient for obtaining desired characteristics of the deposited film for a wide scope of purposes.

In view of the above points, the present invention contemplates the achievement obtained as a result of extensive studies made comprehensively from the standpoints that selection of the starting material suitable for formation of $Si_xC_{1-x}(H)$ film, which plays an important role in constitution of the a-Si type image forming member, is important and it is based on discovery of a starting material for supplying silicon atoms, carbon atoms and hydrogen atoms suited for this purpose.

SUMMARY OF THE INVENTION

An object of the present invention is to provide a method for producing an image forming member having high charge receiving ability and also having excellent electrical, optical and photoconductive characteristics.

Another object of the present invention is to provide a method for producing a photoconductive layer or a non-photoconductive layers which is suitable for protecting the surface of an image forming member or impeding injection of charges from the support.

According to the present invention there is provided a method for producing an image forming member having a deposited layer with photoconductivity formed on a support by introducing a starting material in gaseous state into a deposition chamber which is reduced to a desired pressure and exciting discharging in the gas atmosphere of said starting material, which comprises forming at least a part of said deposited layer with a layer comprising silicon atoms, carbon atoms and hydrogen atoms by use of at least one of the compounds represented by the formula:

$$R_mSi_nH_{2n+2-m} \quad (I)$$

wherein R is an alkyl having 1 to 15 carbon atoms, m is an integer of 1 to 15, n is an integer of 1 to 5, and m and n satisfy the relation of $2n+2>m$.

DESCRIPTION OF THE PREFERRED EMBODIMENTS

Figure 1:
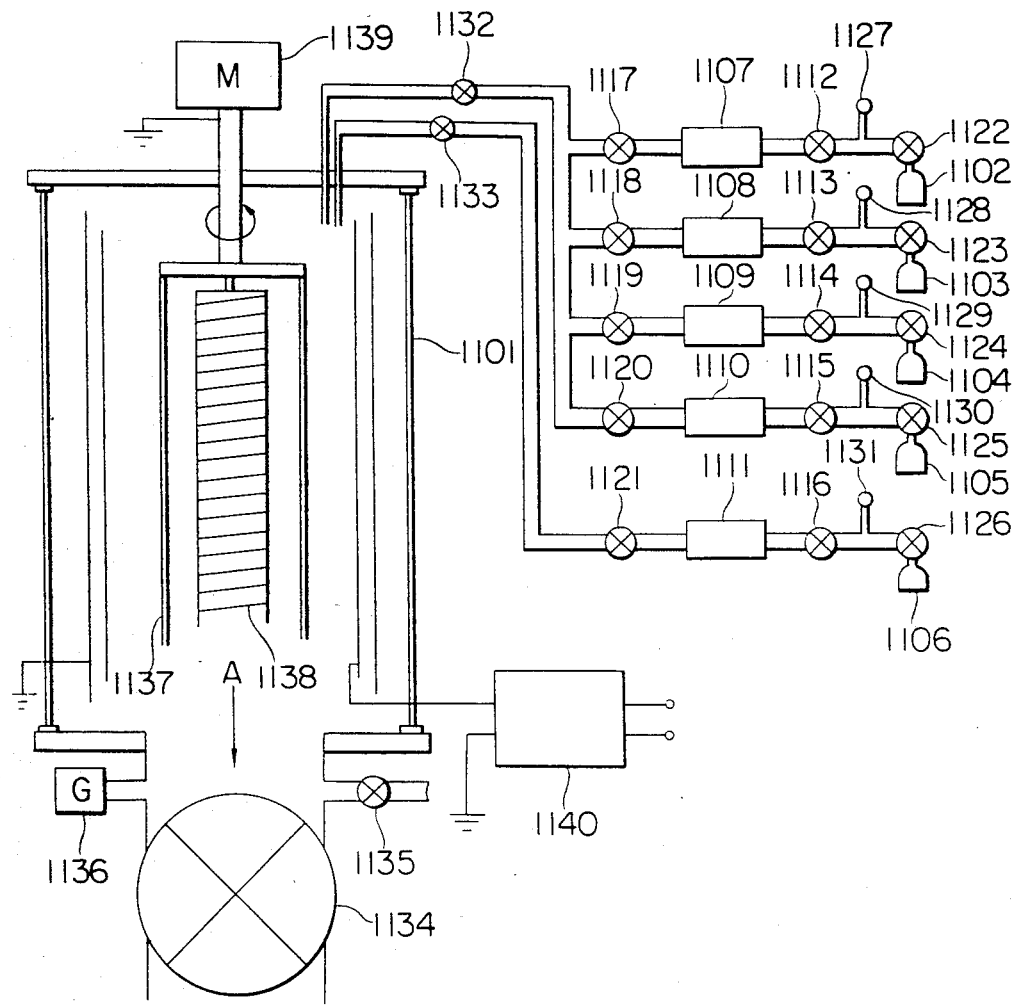
FIG. 1 shows a device according to the glow discharge decomposition method which is suitable for practicing the method for producing the image forming member of the present invention.

The image forming member produced according to the method of the present invention is constituted of at least one deposited layer laminated on a support for image forming member. The deposited layer is ordinarily constituted primarily of a deposited layer having photoconductivity containing a-Si as the main component. Other than this deposited layer, there may also be provided a lower deposited layer between this deposited layer and the support and/or an upper deposited layer on this deposited layer.

The support to be used in the present invention may be either electroconductive or insulating. As the electroconductive material, there may be mentioned metals such as NiCr, stainless steel, Al, Cr, Mo, Au, Nb, Ta, V, Ti, Pt, Pd etc. or alloys thereof.

As insulating support, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating supports should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, $In_2O_3$, $SnO_2$, ITO ($In_2O_3+SnO_2$), etc., thereon. Alternatively, a synthetic resin film such as polyester film, etc. can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface.

The shape of the support may be determined as desired. For example, when it is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be fully exhibited. However, in such a case, the thickness is preferably 10 μm or more from the points of fabrication and handling of the support as well as its mechanical strength.

According to the production method of the present invention, carbon atoms can be introduced into the deposited layer over a wide range of concentrations. The mode for incorporating the carbon atoms into the deposited layer by the present invention can be classified into the three classes as described below.

The first mode is the case in which the method is employed for formation of the lower deposited layer as previously described. Introduction of carbon atoms into the lower deposited layer is done for the purpose of impeding injection of charges from the support or improving adhesion between the support and the deposited layer. In this case, it is possible to effect functional separation by limiting the lower deposited layer containing carbon atoms to the above purpose and laminating a deposited layer containing no carbon atoms for the deposited layer to be formed upper than said lower deposited layer, namely on the side nearer to the surface of the image forming member. Alternatively, also in the upper deposited layer, carbon atoms may be contained continuously, and these variations can be chosen suitably depending on the desired characteristics of the image forming member.

The second mode is the case in which the method is employed for formation of a deposited layer having photoconductivity containing a-Si as the main component. Introduction of carbon atoms into the photoconductive deposited layer is done primarily for the purpose of enhancing the dark resistance, which is deemed to be as important as photoconductivity. In this case, for the lower deposited layer and the upper deposited layer, their constitutions and constituent atoms compositions are not limited at all.

The third mode is the case in which the method is employed for formation of the upper deposited layer. The upper deposited layer is formed generally for prevention of injection of charges from the free surface, protection of the surface or prevention of deterioration. Introduction of carbon atoms into such an upper layer may be done for purposes such as formation of insulating layer, imparting of layer hardness and bonding stabilization between atoms in the layer. Also in this case, the lower deposited layer and the photoconductive deposited layer will not be limited in their constitutions and constituent atom compositions.

In forming such various deposited layers containing silicon atoms, carbon atoms and hydrogen atoms constituting an image forming member, the production method of the present invention is practiced by use of the so-called organohydrogenosilanes represented by the above formula (I).

Examples of the organohydrogenosilanes to be used as the starting material for the deposited layer in the production method of the present invention may include $CH_3SiH_3$, $(CH_3)_2SiH_2$, $(CH_3)_3SiH$, $CH_3Si_2H_5$, $(CH_3)_2Si_2H_4$, $(CH_3)_3Si_2H_3$, $(CH_3)_4Si_2H_2$, $(CH_3)_5Si_2H$, $C_2H_5SiH_3$, $(C_2H_5)_2SiH_2$, $(C_2H_5)_3Si_2H$, $C_2H_5Si_2H_5$, $(C_2H_5)_2Si_2H_4$, $(C_2H_5)_3Si_2H_3$, $(C_2H_5)_4Si_2H_2$, $(C_2H_5)_5Si_2H$, $CH_3Si_3H_7$, $(CH_3)_2Si_3H_6$, $(CH_3)_3Si_3H_5$, $(CH_3)_4Si_3H_4$, $(CH_3)_5Si_3H_3$ and the like.

The above organohydrogenosilane to be used as the starting gas in the production method of the present invention is characterized greatly by having a hydrogen bonded directly to silicon atom together with the Si-C bond in the molecule. Probably because of this Si-H bonding being relatively weak and capable of providing bonding sites relatively enriched in activity, or for some other reasons which are not clarified, a preferable three-dimensional structure can appear certainly during formation of new bonding between the constituent atoms in the deposited layer. This may be estimated to lead to the reason why the deposited layer according to the production method of the present invention can exhibit more excellent characteristics as compared with the case when the layer is formed with the use of other starting materials.

In forming the deposited film according to the production method of the present invention, it is not necessarily required to use the above organohydrogenosilane singly. It is also possible to incorporate carbon atoms at a desired concentration in the deposited film by mixing one or more of these organohydrogenosilanes with other constituent gases and controlling adequately preparation conditions such as mixing ratio and the like.

As other starting gases to be used in combination in this case, when the deposited layer is constituted essentially of silicon atoms, carbon atoms and hydrogen atoms, the starting gas for additively supplying silicon atoms may preferably be hydrogenated silicon (silanes) such as $SiH_4$, $Si_2H_6$, $Si_3H_8$, $Si_4H_{10}$ and the like. On the other hand, when halogen atoms are permitted to coexist, silicon compounds containing halogen atoms, specifically halogenated silicons such as $SiF_4$, $Si_2F_6$, $SiCl_4$, $SiBr_4$ and the like may preferably be employed.

Further, it is possible to incorporate oxygen atoms, nitrogen atoms and others as an aid for making higher resistance of the deposited layer or the group III atoms or the group V atoms of the periodic table for the purpose of controlling polarity, and most of these can be employed as additives which can add their characteristics to the deposited layer without any interference with the function and the characteristics to be exhibited by introduction of carbon atoms into the deposited layer with the use of organohydrogenosilane.

The concentration of carbon atoms to be contained by organohydrogenosilane in the deposited layer should be selected variously depending on the purpose fulfilled by these deposited layers, and therefore it is not reasonable to define its range in general terms. However, generally speaking, when to be contained in the lower layer or the upper layer, it is suitable to use a concentration preferably of $1 \times 10^{-3}$ to 90 atomic %, more preferably 1 to 90 atomic %, based on the total number of atoms constituting the deposited layer. On the other hand, in the case of a deposited layer having photoconductivity, the content of the carbon atoms should preferably be $1 \times 10^{-5}$ to 30 atomic %, more preferably $1 \times 10^{-4}$ to 20 atomic %, based on the total number of atoms.

The deposition method for forming a deposited layer on a support by excitation of discharging in a gas atmosphere of a starting material may include the so-called vacuum deposition methods, utilizing discharging phenomenon, such as the glow discharging method, the sputtering method, the ion plating method and the like. Also, in these vacuum deposition methods, other than the starting gases, the so-called rare gas, such as He, Ne, Ar and the like may of course be used, if desired.

Next, an example of the process for producing the image forming member of the present invention by using the glow discharge decomposition method is to be described.

FIG. 1 shows a device for producing image forming members according to the glow discharge decomposition method.

In the gas bombs 1102–1106, there are hermetically contained starting gases for formation of deposited layers for the image forming member of the present invention. For example, 1102 is a bomb containing $(CH_3)_2SiH_2$ gas (purity: 99.99%), 1103 is a bomb containing $SiH_4$ gas (purity: 99.99%), 1104 is a bomb containing $B_2H_6$ gas (purity: 99.99%) diluted with $H_2$ (hereinafter abbreviated as "$B_2H_6/H_2$"), 1105 is a $NH_3$ gas bomb (purity: 99.99%), and 1106 is a $SiF_4$ gas bomb (purity: 99.99%). Other than these, although not shown in the drawing, it is also possible to provide additional bombs of desired gas species, if necessary.

For allowing these gases to flow into the reaction chamber 1101, on confirmation of the valves 1122–1126 of the gas bombs 1102–1106 and the leak valve 1135 to be closed, and the inflow valves 1112–1116, the outflow valves 1117–1121 and the auxiliary valves 1132 and 1133 to be opened, the main valve 1134 is first opened to evacuate the reaction chamber 1101 and the gas pipelines. As the next step, when the reading on the vacuum indicator 1136 becomes $5 \times 10^{-6}$ Torr, the auxiliary valves 1132 and 1133 and the outflow valves 1117–1121 are closed. Then, $(CH_3)_2SiH_2$ gas from the gas bomb 1102, $SiH_4$ gas from the gas bomb 1103, $B_2H_6/H_2$ gas from the gas bomb 1104, $NH_3$ gas from the gas bomb 1105 and $SiF_4$ gas from the gas bomb 1106 are permitted to flow into the mass-flow controllers 1107–1111, respectively, by controlling the pressures at the outlet pressure gauges 1127–1131 to 1 Kg/cm², respectively, by opening the valves 1122–1126 and opening gradually inflow valves 1112–1116. Subsequently, the outflow valves 1117–1121 and the auxiliary valves 1132 and 1133 are gradually opened to permit respective gases to flow into the reaction chamber 1101. The outflow valves 1117–1121 are controlled so that the flow rate ratio of the respective gases may have a desired value and opening of the main valve 1134 is also controlled while watching the reading on the vacuum indicator 1136 so that the pressure in the reaction chamber may reach a desired value. And, after confirming that the temperature of the substrate cylinder 1137 is set at 50°–400° C. by the heater 1138, the power source 1140 is set at a desired power to excite glow discharge in the reaction chamber 1101. During the layer formation, in order to bring the layer into uniformity, the substrate cylinder 1137 should preferably be rotated at a constant speed by means of a motor 1139.

In the case of forming deposited layers with different constituent atom compositions, the values of all the gas operating systems employed are closed and the reaction chamber 1101 is once evacuated to a high vacuum. When the reading on the vacuum indicator 136 becomes about $5 \times 10^{-6}$ Torr, the same procedure as described above is repeated, the valves required for operation of the respective gases are opened to control the flow rates of the respective gases to desired values, and glow discharging is excited similarly as described above.

The present invention is further explained by referring to the following Examples.

EXAMPLES 1 and 2

By means of the device for preparation of photoconductive member as shown in FIG. 1, deposited layers were formed on a cylinder made of aluminum according to the glow discharge decomposition method as previously described under the preparation conditions as shown in Tables 1 and 2 to form each one image forming member. Also, under the same conditions for forming the uppermost layer of these image forming members, a deposited layer with a thickness of 3 μm was formed on a glass plate.

For the above two image forming members, each member was set in an electrophotographic device for image evaluation. Image evaluation was determined by practicing image formation corresponding in total number to 200,000 sheets under normal environment, and every sample per 10,000 sheets was evaluated for its superiority or inferiority in terms of density, resolution, gradation reproducibility, image defect, etc. As the result, each member was confirmed to have an excellent image formation in very high quality.

Next, these image forming members were heated in an electric furnace at 300° C. for 2 hours and, after cooling, set again in the electrophotographic device to practice image formation, whereby no change was observed at all. Subsequently, these image forming members were placed in an exposure test box capable of effecting uniform irradiation on the image forming member with a halogen lamp arranged on the wall surface, and photoirradiation was effected continuously at a dose corresponding to 200 mW/cm² for 24 hours. After cooling, image formation was practiced but no change could be found.

On the other hand, each of the deposited layers formed on the galss plate was confirmed to be a deposited layer having a signal of $10^{-18}$ cm$^{-3}$ or lower as the result of measurement of electron spin density by ESR.

EXAMPLE 3

An image forming member and the uppermost layer on a glass plate were formed according to the same method as in Example 1 except for changing the preparation conditions of the deposited layer to those as shown in Table 3. For the image forming member, image formation corresponding to 200,000 sheets was conducted and evaluated and it was confirmed that the member could maintain images of good quality with a very high density.

On the other hand, in measurement of ESR, the deposited layer was confirmed to have very little defect, with the value obtained being about $10^{-16}$ cm$^{-3}$.

EXAMPLE 4

An image forming member and the uppermost layer on a glass plate were formed according to the same method as in Example 1 except for changing the preparation conditions of the deposited layer to those as shown in Table 4. In the evaluation of the image forming member, good results substantially equal to Example 3 could be obtained, and a particular feature could be seen in reduction of fluctuation of the receiving potential. On the other hand, ESR signal was equal to that of Example 1.

EXAMPLE 5

Image forming members were produced according to the same method as in Example 1 except for changing variously the gases employed and their flow rates for the deposited layer positioned at the uppermost portion in the conditions for producing image forming members shown in Table 1 to those of Table 5. For these image forming members, image formation was conducted and evaluated. The results obtained were found to be comparable to Example 1.

TABLE 1

| Lamination order | Gases employed and their flow rates (SCCM) | Discharging power (W/cm) | Layer forming speed (Å/sec) | Layer thickness (μm) | Gas pressure (Torr) | Cylinder temperature (°C.) | Discharging frequency (MHz) |
| --- | --- | --- | --- | --- | --- | --- | --- |
| 1 | SiH$_4$:300 NO:12 B$_2$H$_6$:0.03 | 0.2 | 18 | 20 | 0.2 | 250 | 13.56 |
| 2 | (CH$_3$)$_2$SiH$_2$:150 Ar:150 | 0.2 | 5 | 0.1 | 0.2 | 250 | 13.56 |

TABLE 2

| Lamination order | Gases employed and their flow rates (SCCM) | Discharging power (W/cm) | Layer forming speed (Å/sec) | Layer thickness (μm) | Gas pressure (Torr) | Cylinder temperature (°C.) | Discharging frequency (MHz) |
| --- | --- | --- | --- | --- | --- | --- | --- |
| 1 | SiH$_4$:200 NO:10 B$_2$H$_6$:0.5 He:400 | 0.2 | 10 | 0.5 | 0.3 | 250 | 13.56 |
| 2 | SiH$_4$:200 He:400 | 0.2 | 9 | 20 | 0.3 | 250 | 13.56 |

TABLE 2-continued

| Lamination order | Gases employed and their flow rates (SCCM) | Discharging power (W/cm) | Layer forming speed (Å/sec) | Layer thickness (μm) | Gas pressure (Torr) | Cylinder temperature (°C.) | Discharging frequency (MHz) |
|---|---|---|---|---|---|---|---|
| 3 | $(CH_3)_4Si_2H_2$:100 Ar:200 | 0.2 | 8 | 0.1 | 0.22 | 250 | 13.56 |

TABLE 3

| Lamination order | Gases employed and their flow rates (SCCM) | Discharging power (W/cm) | Layer forming speed (Å/sec) | Layer thickness (μm) | Gas pressure (Torr) | Cylinder temperature (°C.) | Discharging frequency (MHz) |
|---|---|---|---|---|---|---|---|
| 1 | $SiH_4$:300 $(CH_3)_2SiH_2$:15 | 0.2 | 18 | 20 | 0.2 | 250 | 13.56 |

TABLE 4

| Lamination order | Gases employed and their flow rates (SCCM) | Discharging power (W/cm) | Layer forming speed (Å/sec) | Layer thickness (μm) | Gas pressure (Torr) | Cylinder temperature (°C.) | Discharging frequency (MHz) |
|---|---|---|---|---|---|---|---|
| 1 | $CH_3SiH_3$:150 Ar:150 | 0.2 | 6 | 0.5 | 0.2 | 250 | 13.56 |
| 2 | $SiH_4$:300 | 0.2 | 17 | 20 | 0.2 | 250 | 13.56 |

TABLE 5

| Starting gases employed | Starting gas flow rate (SCCM)/ Diluting gas and its amount (SCCM) |
|---|---|
| $CH_3SiH_3$ | 50/Ar 600; 100/Ar 500; 300/Ar 300; 100/$H_2$ 500; 300/$H_2$ 100; 300/$H_2$ 200; 300/$H_2$ 300 |
| $(CH_3)_2SiH_2$ | The same seven species as above. |
| $(CH_3)_3SiH$ | The same seven species as above. |
| $CH_3Si_2H_5$ | The same seven species as above. |
| $(CH_3)_2Si_2H_4$ | The same seven species as above. |
| $(CH_3)_4Si_2H_2$ | The same seven species as above. |
| $C_2H_5Si_2H_5$ | The same seven species as above. |

What I claim is:

1. A method for producing an image forming member having a deposited layer with photoconductivity formed on a support by introducing starting material in gaseous state into a deposition chamber which is reduced to a desired pressure and exciting discharging in the gas atmosphere of said starting material, which comprises constituting at least a part of said deposited layer of a layer (A) comprising silicon atoms, carbon atoms and hydrogen atoms, said layer (A) being formed by composition of at least one of the compounds represented by the formula:

$$R_mSi_nH_{2n+2-m} \qquad (I)$$

wherein R is an alkyl having 1 to 15 carbon atoms, m is an integer of 1 to 15, n is an integer of 1 to 5, and m and n satisfy the relation of $2n+2>m$.

2. A method according to claim 1, wherein the compound represented by the formula (I) is selected from the group consisting of $CH_3SiH_3$, $(CH_3)_2SiH_2$, $(CH_3)_3SiH$, $CH_3Si_2H_5$, $(CH_3)_2Si_2H_4$, $(CH_3)_3Si_2H_3$, $(CH_3)_4Si_2H_2$, $(CH_3)_5Si_2H$, $C_2H_5SiH_3$, $(C_2H_5)_2SiH_2$, $(C_2H_5)_3Si_2H$, $C_2H_5Si_2H_5$, $(C_2H_5)_2Si_2H_4$, $(C_2H_5)_3Si_2H_3$, $(C_2H_5)_4Si_2H_2$, $(C_2H_5)_5Si_2H$, $CH_3Si_3H_7$, $(CH_3)_2Si_3H_6$, $(CH_3)_3Si_3H_5$, $(CH_3)_4Si_3H_4$, and $(CH_3)_5Si_3H_3$.

3. A method according to claim 1, wherein the starting material for layer formation comprising a hydrogenated silicon.

4. A method according to claim 3, wherein the hydrogenated silicon is selected from the group consisting of $SiH_4$, $Si_2H_6$, $Si_3H_8$, and $Si_4H_{10}$.

5. A method according to claim 1, wherein the starting material for layer formation comprises a silicon compound containing halogen atoms.

6. A method according to claim 5, wherein the silicon compound containing halogen atoms is selected from the group consisting of $SiF_4$, $Si_2F_6$, $SiCl_4$, and $SiBr_4$.

7. A method according to claim 1, wherein the starting material for layer formation comprises $B_2H_6$.

8. A method according to claim 1, wherein the layer (A) contains $1 \times 10^{-3}$ to 90 atomic % of carbon atoms based on the total number of atoms constituting said layer (A).

9. A method according to claim 1, wherein the layer (A) contains $1 \times 10^{-5}$ to 30 atomic % of carbon atoms based on the total number of atoms constituting said layer (A).

10. A method according to claim 1, wherein the layer (A) has photoconductivity.

11. A method according to claim 1, wherein the support is shaped in a cylinder.

12. A method according to claim 1, wherein the support is shaped in a belt.

* * * * *